(12) United States Patent
Ke et al.

(10) Patent No.: US 8,334,175 B1
(45) Date of Patent: Dec. 18, 2012

(54) MANUFACTURING METHOD OF LED PACKAGE STRUCTURE

(75) Inventors: Chih-Hsun Ke, Hsinchu (TW); Ming-Ta Tsai, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/441,935

(22) Filed: Apr. 9, 2012

(30) Foreign Application Priority Data

Jul. 29, 2011 (CN) .......................... 2011 1 0215557

(51) Int. Cl.
*H01L 21/00* (2006.01)
(52) U.S. Cl. ................... 438/124; 438/28; 257/E21.502
(58) Field of Classification Search .................... 438/63; 257/E21.502
See application file for complete search history.

(56) References Cited

U.S. PATENT DOCUMENTS

2010/0230710 A1* 9/2010 Kim ................................ 257/99

* cited by examiner

*Primary Examiner* — Cheung Lee
(74) *Attorney, Agent, or Firm* — Altis Law Group, Inc.

(57) ABSTRACT

A method for manufacturing a holder of an LED package structure includes steps: providing first and second electrical portions; providing a mold including an upper die and a bottom die, the bottom die defining a receiving groove in a top surface thereof, the upper die including a core component and a wall around and spaced from the core component; putting the first and second electrical portions in the receiving groove of the bottom die, mounting the upper die on the bottom die; injecting liquid molding material into the receiving groove of the bottom die through a sprue between the wall and the core component; solidifying the liquid molding material and removing the upper die and the bottom die to obtain the holder which includes the first and second electrical portions and the solidified liquid molding material.

12 Claims, 7 Drawing Sheets

MANUFACTURING METHOD OF LED PACKAGE STRUCTURE

BACKGROUND

1. Technical Field

The disclosure relates a manufacturing method of an LED (light emitting diode) package structure, and particularly to a manufacturing method of a holder of the LED package structure.

2. Discussion of Related Art

Light emitting diodes' (LEDs) many advantages, such as high luminosity, low operational voltage, low power consumption, compatibility with integrated circuits, easy driving, long term reliability, and environmental friendliness have promoted their wide use as a lighting source.

A typical LED package structure includes a base, first and second electrodes secured to the base, a plurality of LEDs arranged on the base and electrically connected to the first and second electrodes, and a projection arranged on the base and surrounding the LEDs. The projection is used to receive encapsulation therein, which covers the LEDs and to function as a reflector for reflecting light from the LEDs. However, the projection and the base which are parts of a holder, are formed in different steps; therefore, the method for manufacturing the typical LED package is complicated, and the manufacturing cost thereof is increased.

Therefore, what is needed is a method for manufacturing an LED package structure, particularly for manufacturing a holder thereof which can overcome the described limitations.

BRIEF DESCRIPTION OF THE DRAWINGS

Many aspects of the disclosure can be better understood with reference to the following drawing. The components in the drawing are not necessarily drawn to scale, the emphasis instead being placed upon clearly illustrating the principles of the present light emitting diode package for microminiaturization. Moreover, in the drawing, like reference numerals designate corresponding parts throughout the whole view.

DETAILED DESCRIPTION OF EMBODIMENTS

Referring to FIGS. 1 to 5, a method for manufacturing an LED package structure, in accordance with an embodiment, is provided, which includes the following steps.

Figure 1:
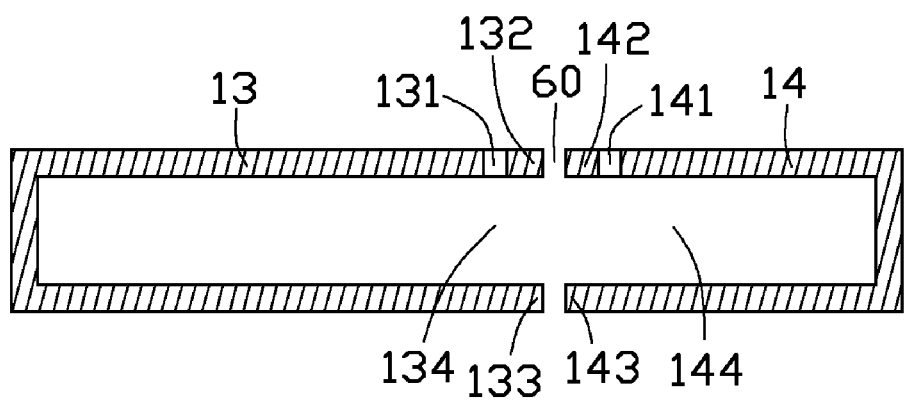
FIG. 1 to FIG. 7 are cross-sectional views showing different steps of an embodiment of a method for manufacturing an LED package, according to an exemplary embodiment of the present disclosure.
Figure 2:
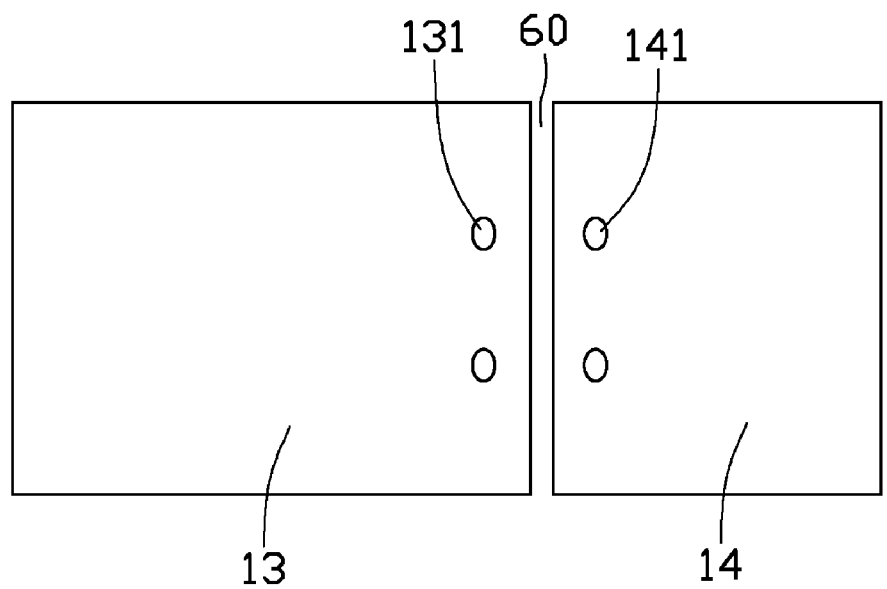

Referring to FIGS. 1 and 2, the first step is to provide a first electrical portion 13 and a second electrical portion 14. A cross-section view of the first or second electrical portions 13, 14 is U-shaped. A first and second ends 132, 133 of the first electrical portion 13 are opposite to and spaced from a third and fourth ends 142, 143 of the second electrical portion 14, respectively. In other words, the first and second electrical portions 13, 14 are horizontally positioned, while a first opening 134 of the first electrical portion 13 faces a second opening 144 of the second electrical portion 14. A gap 60 is defined between the first electrical portion 13 and the second electrical portion 14. In the embodiment, two first through holes 131 are defined in the first end 132 of the first electrical portion 13, two second through holes 141 are defined in the third end 142 of the second electrical portion 14. The first and through holes 131, 141 are adjacent to the gap 60.

Figure 3:
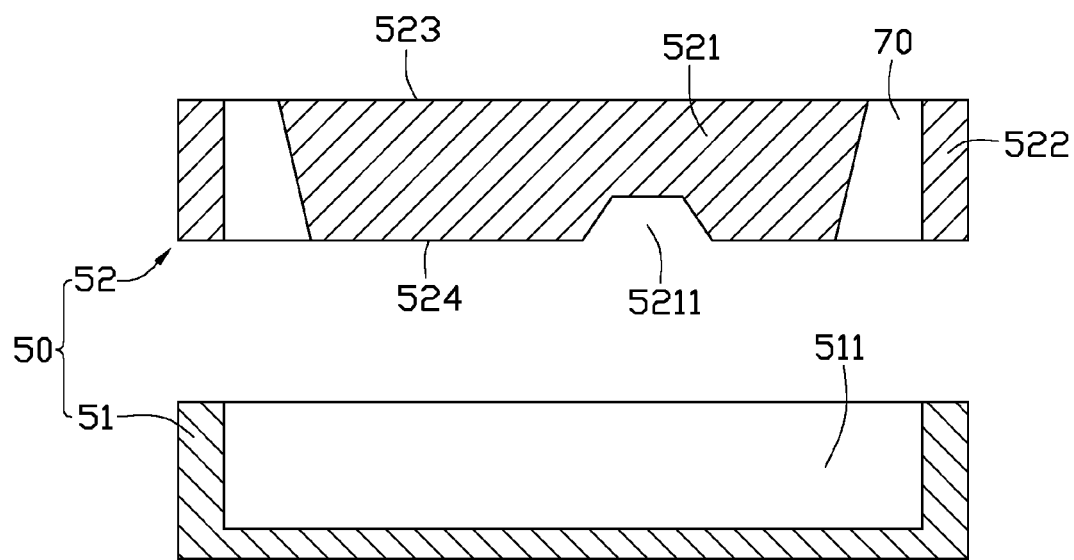

Referring to FIG. 3, the second step is to provide a mold 50. The mold 50 includes a bottom die 51 and an upper die 52. The bottom die 51 defines a rectangular receiving groove 511 in a top surface thereof. The receiving groove 511 is corresponding to and receives the first and second electrical portions 13, 14 therein. The top surface of the bottom die 51 is coplanar with an upper surface of the first electrical portion 13 and an upper surface of the second electrical portion 14. The upper die 52 includes a core component 521 and a wall 522 around and spaced from the core component 521. In the present embodiment, an upper surface 523 and a bottom surface 524 of the core component 521 are respectively coplanar with an upper surface and a bottom surface of the wall 522. A cross-sectional view of the core component 521 is trapezeform, and a width of the core component 521 is gradually decreased from the upper surface 523 to the bottom surface 524. An annular sprue 70 is defined between the core component 521 and the wall 522. The sprue 70 has a width which is gradually increased along a top-to-bottom direction. An elongated groove 5211 is defined in the bottom surface 524 of the core component 521, which extends through a front surface (not labeled) and a rear surface (not shown) of the core component 521. A cross-sectional view of the groove 5211 is trapezeform, and a width of the groove 5211 is gradually decreased along a direction from the bottom surface 524 to the upper surface 523.

Figure 4:
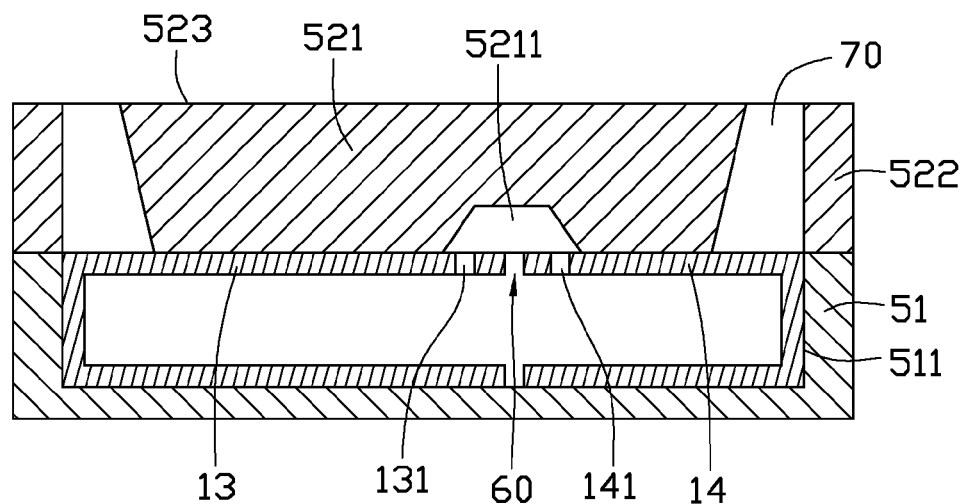
Figure 5:
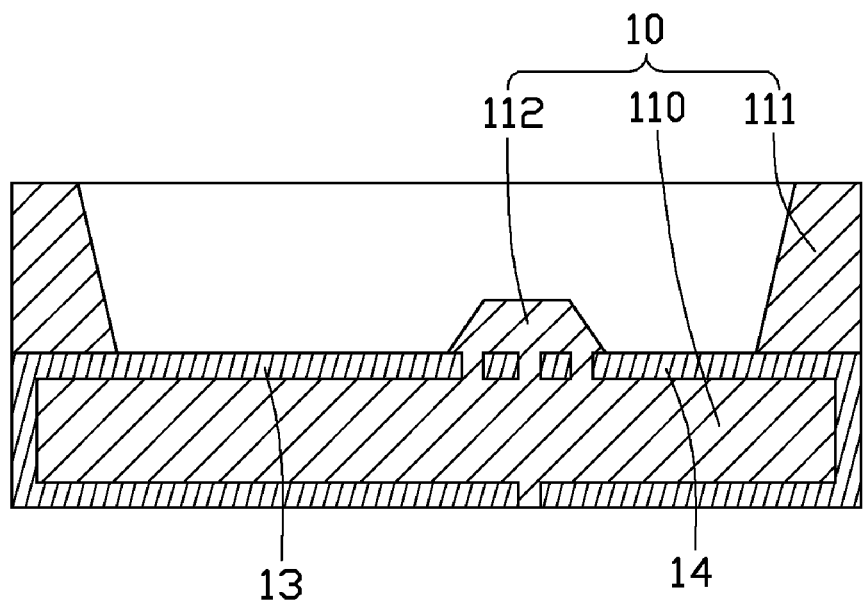

Referring to FIGS. 4 and 5, the third step is to arrange the first electrical portion 13 and the second electrical portion 14 in the receiving groove 511 of the bottom die 51, and put the upper die 52 on the bottom die 51. The first and second electrical portions 13, 14 are separated and electrically insulated from each other. The core component 521 of the upper die 52 is on the first and second electrodes 13, 14, and the wall 522 of the upper die 52 is on the bottom die 51. The groove 5211 of the core component 521 communicates with the receiving groove 511 via the gap 60 and the first and second through holes 131, 141. In the present embodiment, two opposite outer surfaces of the first and second electrical portion 13, 14 at opposite lateral sides thereof contact an inner surface of the bottom die 51. The inner surface of the bottom die 51 is coplanar with an inner surface of the wall 522 of the upper die 52.

The fourth step is to inject liquid molding material, for example, molten polymer material, into the receiving groove 511 of the bottom die 51 via the sprue 70 between the wall 522 and the core component 521 of the upper die 52. In the present embodiment, the liquid molding material fills in the receiving groove 511 and then flows to the groove 5211 via the gap 60 and the first and second through holes 131, 141. The liquid molding material is continuously injected into the sprue 70 until the receiving groove 511, the groove 5211 and the sprue 70 are filled with the liquid molding material. In the present embodiment, an upper surface of the liquid molding material filled in the sprue 70 is coplanar with the upper surface 523 of the upper die 52.

Figure 6:
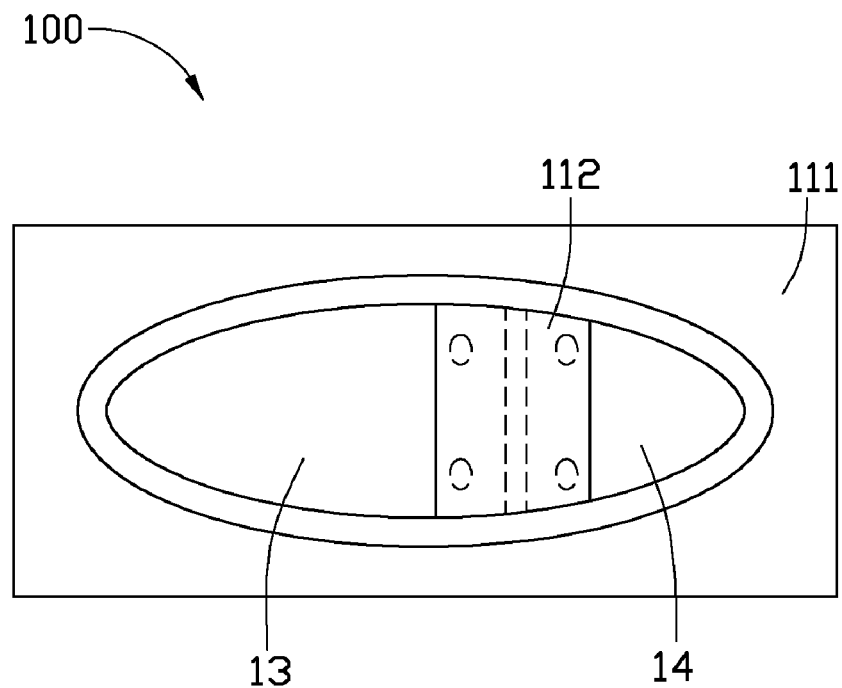

Referring to FIG. 6, the fifth step is to solidify the liquid molding material and move the upper die 52 and the bottom die 51, thereby forming a holder 10. In the present embodiment, the holder 10 includes the base 110, the dam 112 corresponding to the groove 5211 of the core component 521, the reflector cup 111 corresponding to the sprue 70 and the first and second electrical portions 13, 14. The base 110 is surrounded by the first and second electrical portions 13, 14. The reflector cup 111 is annular and surrounds the dam 112. The dam 112 extends in the reflector cup 10 and generally divides a lower part of a space surrounded by the reflector cup 111 into two parts.

Figure 7:
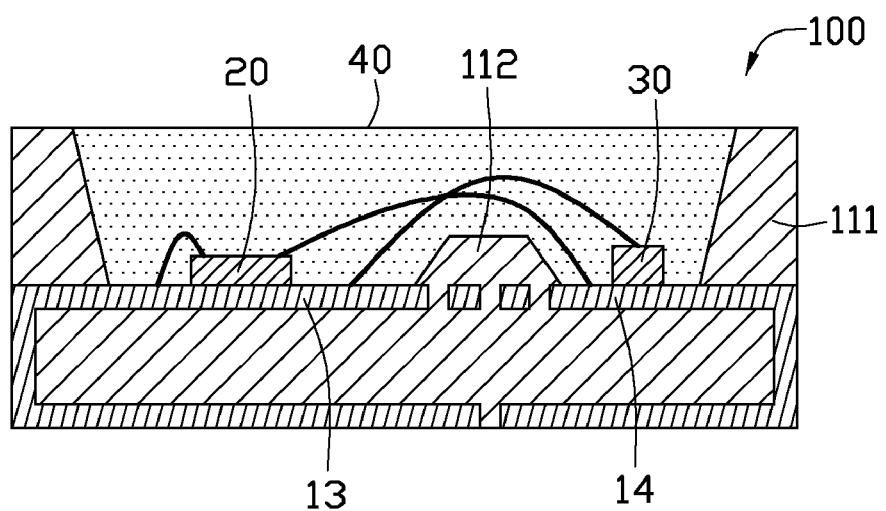

Referring to FIG. 7, the sixth step is to secure a first LED chip 20 on the first electrical portion 13 and a second LED chip 30 on the second electrical portion 14, thereby forming an LED package structure 100. The first LED chip 20 is separated from the second LED chip 30 by the dam 112. The dam 112 is used to prevent interference of light beams of the two LED chips 20, 30, which are different type LED chips respectively emitting light beams of short wavelength (for example, blue light) and long wavelength (for example, red light). In addition, the dam 112 is used as an additional reflector for increasing the light extracting efficiency of the LED package structure 100.

A first electrode and a second electrode of the first LED chip 20 are electrically connected to the first and second electrical portion 13, 14 via wires, respectively. A first electrode of the second LED chip 30 is electrically connected to the first electrical portion 13 via a wire, while a second electrode of the second LED chip 30 is directly mounted to the second electrical portion 14. In the present embodiment, an encapsulation 40 is received in the reflector cup 111 and covers the first and second LED chips 20, 30. A top surface of the encapsulation 40 is substantially coplanar with a top surface of the reflector cup 111.

The dam 112 and the reflector cup 111 are integrally formed with the base 110 as a single piece; therefore, the method for manufacturing the LED package structure 100, particularly for manufacturing the holder thereof which includes the base 110, the reflector cup 111 and the dam 112 is easier, and the manufacturing cost is reduced, compared with the conventional manufacturing method.

It is to be further understood that even though numerous characteristics and advantages have been set forth in the foregoing description of embodiments, together with details of the structures and functions of the embodiments, the disclosure is illustrative only; and that changes may be made in detail, especially in matters of shape, size, and arrangement of parts within the principles of the disclosure to the full extent indicated by the broad general meaning of the terms in which the appended claims are expressed.

What is claimed is:

1. A method for manufacturing a holder of an LED package structure, comprising:
   providing a first electrical portion and a second electrical portion, a gap being defined between the first and second electrical portions;
   providing a mold, the mold comprising an upper die and a bottom die, the bottom die defining a receiving groove in a top surface thereof for receiving the first and second electrical portions, the upper die comprising a core component and a wall around and spaced from the core component, a sprue being defined between the core component and the wall, the core component defining an elongated groove in a bottom surface thereof;
   putting the first and second electrical portions in the receiving groove of the bottom die wherein the first and second electrical portions are separated from each other by the gap, mounting the upper die on the bottom die in a manner that the elongated groove of the core component communicates with the receiving groove via the gap between the first electrode and the second electrical portions;
   injecting liquid molding material into the receiving groove of the bottom die through the sprue between the wall and the core component until the receiving groove, the elongated groove and the sprue are filled with the liquid molding material; and
   solidifying the liquid molding material and removing the upper die and the bottom die to obtain the holder including the solidified liquid molding material and the first and second electrical portions.

2. The method of claim 1, wherein the first and second electrical portions are U-shaped and horizontally positioned, and a first opening of the first electrical portion faces a second opening of the second electrical portion.

3. The method of claim 2, wherein the first and second electrical portions each define at least a through hole adjacent to the gap, the elongated groove of the core component communicating with the receiving groove via the gap and the at least a through hole.

4. The method of claim 1, wherein the core component comprises an upper surface opposite to the bottom surface, a cross-sectional view of the elongated groove is trapezeform, and a width of the elongated groove is gradually decreased along a direction from the bottom surface to the upper surface.

5. The method of claim 1, wherein the core component comprises an upper surface opposite to the bottom surface, a cross-sectional view of the core component is trapezeform, and a width of the core component is gradually decreased from the upper surface to the bottom surface.

6. The method of claim 1, wherein the holder comprises a dam formed in the elongated groove, a base formed in the receiving groove, and a reflector cup formed in the sprue, the dam dividing a space surrounded by the reflector cup into two parts.

7. A method for manufacturing an LED package structure with a holder, comprising:
   providing a first electrical portion and a second electrical portion, a gap being defined between the first and second electrical portions;
   providing a mold comprising an upper die and a bottom die, the bottom die defining a receiving groove in a top surface thereof for receiving the first and second electrical portions, the upper die comprising a core component and a wall around and spaced from the core component, a sprue being defined between the core component and the wall, the core component defining an elongated groove in a bottom surface thereof;
   putting the first and second electrical portions in the receiving groove of the bottom die wherein the first and second electrical portions are separated from each other via the gap, and mounting the upper die on the bottom die in a manner that the elongated groove of the core component communicates with the receiving groove via the gap between the first electrode and the second electrical portions;
   injecting liquid molding material into the receiving groove of the bottom die through the sprue between the wall and the core component until the receiving groove, the elongated groove and the sprue are filled with the liquid molding material;
   solidifying the liquid molding material and removing the upper die and the bottom die to form a holder which includes the solidified liquid molding material and the first and second electrical portions; and
   setting a first LED chip on the first electrical portion and a second LED chip on the second electrical portion and electrically connecting the first and second LED chips with the first and second electrical portions.

8. The method of claim 7, wherein the first and second electrical portions are U-shaped and horizontally positioned, and a first opening of the first electrical portion faces a second opening of the second electrical portion.

9. The method of claim 8, wherein the first and second electrical portions each define a plurality of through holes adjacent to the gap, the elongated groove of the core component communicating with the receiving groove via the gap and the through holes.

10. The method of claim 7, wherein the core component comprises an upper surface opposite to the bottom surface, a cross-sectional view of the elongated groove is trapezeform, and a width of the elongated groove is gradually decreased along a direction from the bottom surface to the upper surface.

11. The method of claim 7, wherein the core component comprises an upper surface opposite to the bottom surface, a cross-sectional view of the core component is trapezeform, and a width of the core component is gradually decreased from the upper surface to the bottom surface.

12. The method of claim 7, wherein the first LED chip is separated from the second LED chip by a dam formed by the liquid molding material received in the elongated groove.

* * * * *